United States Patent [19]

Bertram et al.

[11] 3,753,005

[45] Aug. 14, 1973

[54] INTEGRATED CIRCUIT COMPRISING STRIP-LIKE CONDUCTORS

[75] Inventors: Uwe Bertram, Hamburg; Hans Hoffman, Friedrichsgabe; Hans Wilhelm Neuhaus, Hamburg, all of Germany

[73] Assignee: U.S. Philips Corporation, New York, N.Y.

[22] Filed: June 3, 1971

[21] Appl. No.: 149,756

Related U.S. Application Data

[63] Continuation of Ser. No. 851,231, Aug. 19, 1969, abandoned.

[30] Foreign Application Priority Data

Aug. 20, 1968 Germany .................. P 17 62 759.7

[52] U.S. Cl. ................. 307/213, 307/215, 307/303, 317/235 D, 317/235 F, 340/347 DD

[51] Int. Cl. ........................ H03k 19/08, G08c 5/00

[58] Field of Search .................... 307/213, 303, 215; 317/235 D, 235 F; 340/347 DD

[56] References Cited

UNITED STATES PATENTS

| | | | |
|---|---|---|---|
| 3,284,677 | 11/1966 | Haas | 307/213 X |
| 3,292,012 | 12/1966 | Cook, Jr. | 307/213 |
| 3,381,270 | 4/1968 | Huffman et al. | 340/347 X |
| 3,402,330 | 9/1968 | Archer | 317/235 D |
| 3,448,344 | 6/1969 | Schuster et al. | 317/235 F |
| 3,506,815 | 4/1970 | Stone | 340/347 X |
| 3,518,449 | 6/1970 | Chung | 307/213 X |

*Primary Examiner*—Stanley D. Miller, Jr.
*Attorney*—Frank R. Trifari

[57] ABSTRACT

An integrated circuit using ETL gates especially useful for code conversion is described. All of the input transistors of the gate having interconnected emitters and interconnected collectors. The inputs are made to the base regions and are supplied by means of a series of parallel, strip-like conductors on top of the circuit and passing over the input transistors. At least some of the input transistors have elongated base regions which extend perpendicular to the direction of the strip conductors so as to locate the base contact for the base region directly underneath the conductor to which it is connected. Space is provided between the conductors for the emitter interconnections and for connection to a coupling resistor. The arrangement described avoids many of the crossovers of the input conductors required in the prior art arrangement.

9 Claims, 5 Drawing Figures

Figure 1:
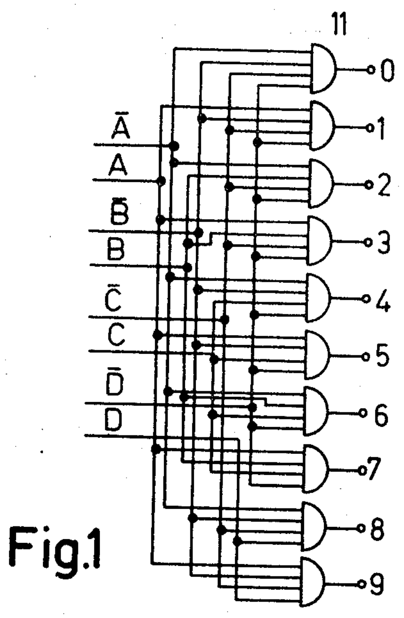

INVENTORS
UWE BERTRAM
HANS HOFFMANN
HANS W. NEUHAUS
BY
Frank R. Trifari
AGENT

*INVENTORS*
UWE BERTRAM
HANS HOFFMANN
HANS W. NEUHAUS

*BY* Frank R. Trifari

AGENT

INTEGRATED CIRCUIT COMPRISING STRIP-LIKE CONDUCTORS

This application is a continuation of Ser. No. 851,231, filed Aug. 19, 1969, and now abandoned.

The invention relates to an integrated circuit comprising a semiconductor body in which a number of transistors are present and strip-like supply or connection conductors, which extend on an insulating layer present on the semi-conductor body, are connected to semi-conductor regions of the transistors through windows in the insulating layer.

As is known, intersecting or crossing connections in integrated circuits often present problems. The number of intersections is usually restricted as much as possible in which, in the case of a single wiring layer, the crossovers which cannot be avoided are constructed in the form of diffused subways which are insulated by oxide of the conductor track to be crossed. The reliability of such a crossover depends inter alia upon the thickness of said insulating oxide layer.

In order to keep the required crystal surface area as small as possible, the layout of such integrated circuits are arranged as favourably as possible from the standpoint of surface area consumption. The pattern of conductive tracks necessary for the electric connections often becomes extra complicated since crossovers are avoided as much as possible, while in addition, the crossovers that cannot be avoided may require considerably extra surface area.

It is the object of the invention to provide integrated circuits having a simple layout in which substantially no extra space is required for crossing connections. The invention is based on the recognition of the fact that this can be achieved by starting from a simple pattern of conductive tracks and adapting the place and the dimensions of the required circuit elements to the pattern of conductive tracks.

According to the invention an integrated circuit of the type mentioned in the preamble is characterized in that the connection conductors extend substantially parallel to each other, with the semiconductor regions of the transistor in the integrated circuit extending to respective points below the associated connection conductors to which they are connected. The respective dimensions of a number of semiconductor regions are adjusted in a direction at right angles to the connection conductors to accommodate the conneciton conductors.

In this manner the invention provides integrated circuits having a simple lay-out in which all or substantially all the crossovers are realized by means of the required circuit elements.

It is to be noted that it is known per se in integrated circuits to use the semiconductor regions of resistors as subways for intersections.

The invention is of particular advantage in logic circuit arrangements in which the desired connections easily result in a large number of intersecting connections, and an important preferred embodiment of the integrated circuit according to the invention is characterized in that the transistors are combined elecctrically to form a number of logic gates.

Application of the invention will usually result in a lay-out in which a number of transistors, which are equal from a circuit technical point of view, have different dimensions in a direction at right angles to the supply conductors.

In a logic integrated circuit according to the invention the gates preferably comprise one transistor per input, in which an individual gate has both the collector regions and the emitter regions of the transistors thereof connected together and the base regions of such transistors constitute the electric inputs of the gate.

The number of required intersections can further be diminished by using "nor"-gates in ETL-arrangement in which the emitter regions of the transistors forming a gate are also connected, through a resistor, to the base region of a transistor connected as an inverter. This type of circuit arrangement is readily suitable for application of the invention.

The transistors can advantageously be arranged in two parallel rows, the supply or connection conductors which extend parallel to the transistor rows being divided into two groups and being connected to the base regions of the transistors. The emitter regions of the transistors extend to between the two groups of supply conductors and the interconnections of said emitters are situated between the two conductor groups, the resistor comprising a connection point situated between the two groups and extending from there underneath a group of supply conductors to beyond said group.

An important embodiment of the integrated circuit according to the invention is characterized in that the gates are arranged so as to form a circuit for converting information from one code into another code, preferably from a four-bit-binary code into a one-out-of-ten code.

Figure 2:
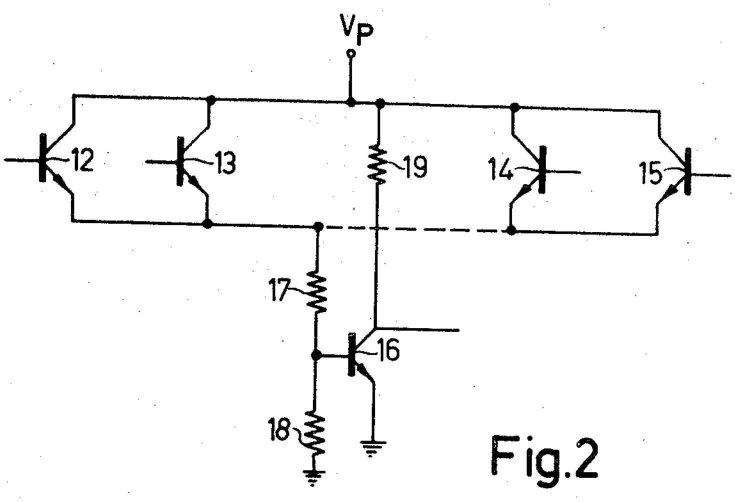
Figure 3:
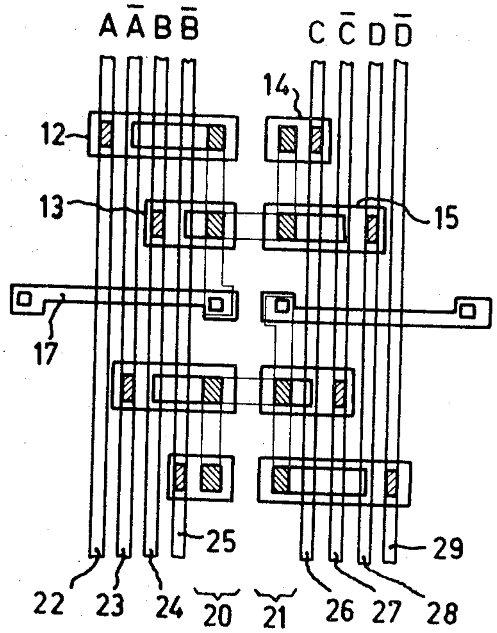
Figure 4A:
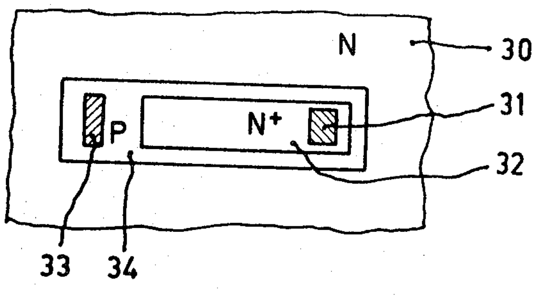
Figure 4B:
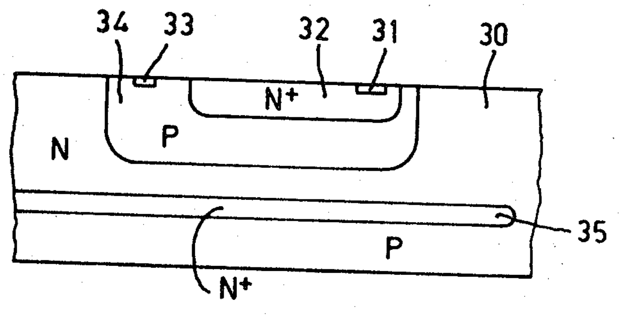

In order that the invention may be readily carried into effect, certain embodiments thereof will now be described in greater detail, by way of example, with reference to the accompanying drawing, in which FIG. 1 is a circuit arrangement for converting a four-bit-binary code, into a one-out-of-ten decimal code, FIG. 2 shows a nor-gate in ETL-arrangement, FIG. 3 shows two of these nor-gates, as a part of an integrated circuit, FIGS. 4*a* and 4*b* show a transistor having an elongate base and emitter region.

The circuit arrangement shown in FIG. 1 comprises 10 outputs which correspond to the decimal numbers 0 to 9 inclusive. Each output is controlled by a gate 11 having four inputs to which the input signals of the binary code are applied directly or, dependent upon the digit associated with the relative gate, are applied in an inverted form. For each combination of input signals maximally one gate supplies an output signal. When the combination of applied signals does not correspond to one of the numbers 0 to 9 inclusive, none of the gates supplies an output signal. This circuit diagram already gives an impression of the large number of crossing intersections which arises.

As shown in FIG. 2, the gates are constructed as an ETL-circuit. The four transistors 12 to 15 have their collectors connected to the positive supply voltage $V_p$, while the input signals are supplied to the bases and the emitters are interconnected and connected to a resistor 17. This resistor 17 connects the emitters to the base of a transistor 16 connected as an inverter. As long as the bases of the four transistors 12 to 15 all have a low potential, the potential of the emitter is also low and the transistor 16 is non-conductive so that no current flows through the resistor 19 and the collector substantially has the positive supply voltage. The resistor 18 serves to ensure the non-conductivity of the transistor 16 in this condition. When, however, the base of one or more of the four transistors 12 to 15 has a high potential, the emitters will also have a voltage at which the transistors 16 is switched on through the resistors 17 and its collector has a low voltage. In order to obtain the function of the logic circuit shown in FIG. 1, the signals, upon application of the gates shown in FIG. 2, must be applied at A, $\overline{A}$ etc. with a low voltage, so that output signals of a high voltage result.

These ETL gates can simply be constructed as a monolithic integrated circuit. Since, as is known, transistors with the same collector potential can be provided in an integrated circuit in a common island and moreover, because the resistors lie at the positive supply voltage, all the forty input transistors of the circuit can be situated in one island together with the resistors. The low-ohmic collector connection of the individual transistors is obtained with a buried layer.

The transistors 12 to 15 (FIG. 3) preferably are provided in two parallel rows and are mutually spaced apart by a small distance, in which case two transistors of the gates in each row and the associated pairs of transistors in the two rows are located opposite to each other. The four transistors 12 to 15 form a square as is shown in FIG. 3. The connection conductors 22–29 extend in parallel and are divided into two groups and the connection of each transistor to the associated connection conductor is carried out in that the base and emitter regions extend in a direction at right angles to the connection conductors. This has for its result that the transistors 12 to 15, which in the circuit diagram fulfill an identical function, nevertheless have different dimensions in the integrated constructions. Generally, in the invention, transistors which are equal from a point of view of circuit technology (that is, they fulfill a function in the circuit so that the electric properties of these transistors need not be mutually different, so that these transistors can be produced in the semiconductor body, for example, as far as doping and geometry is concerned, in identical fashion) will nevertheless have different dimensions, as dictated by the wiring pattern chosen.

FIG. 4*a* is a plan view on an enlarged scale of a separation elongate transistor. In this figure the surroundings of the transistor are a part of the *n*-type island 30 of the crystal. The base region 34 is elongated until it extends up to the associated connection conductor to which the base contact 33 is connected. The emitter region 32 extends up to the proximity of the base contact 33 and is provided with a contact 31 on the and located opposite the base contact 33. The cross-sectional view of a transistor shown in FIG. 4a shows the base and emitter regions 34 and 34, 32 respectively, as they are obtained in the planar manufacturing process. Furthermore the placement of the base contact 33, of the emitter contact 31 and of the buried layer 35, which forms the low-ohmic collector connections, are shown.

Instead of the above described geometry, another geometry may be used in which only the base region is elongated. The advantage is that the supply conductors extend over fewer stages in the oxide layer, while furthermore it is of importance that the oxide above the base of an integrated planar transistor is considerably thicker than above the emitter. As compared with the conventional transistor configuration, both possibilities result in an undesired extra resistance. In the elongated emitter an extra emitter series resistance $r_e$ results and in the elongated base an extra base resistance $r_b$ results. These extra resistances influence the charging and discharging of stray capacitances at the emitter unfavourably. The ratio of the sheet resistances of the base diffusion and the emitter diffusion is approximately 200 : 1½. Taking into account the smaller dimensions of the emitter, a ratio of 1 : 100 results for the resistances $r_e$ and $r_b$. With a current amplification factor of the transistor which is smaller than 100, a preference for the configuration having the elongated emitter region results with respect to the said resistances.

By providing the emitter and the ETL-resistor at a small mutual distance, the critical stray capacitance can be kept small. In order to be able to derive the information of the transistor 13, which becomes available in the centre of the lay-out at the edge of the crystal, the resistor 17 is advantageously used as a subway as is shown in FIG. 3.

When the four transistors 12 to 15 are situated in the form of a square, as is shown in FIG. 3, the optimum crystal surface is used. The supply conductors are preferably distributed between the two groups in such manner that both transistor rows contain the same number of transistors. In FIG. 3, for example, one group consists of the supply conductors A, $\overline{A}$, B, $\overline{B}$, while the second group consists of the supply conductors C, $\overline{C}$, D, $\overline{D}$ . However, it will be obvious that this distribution is only one of the many possibilities.

What is claimed is:

1. An integrated circuit comprising a semiconductor body containing at least one logic gate, said gate comprising plural input transistors each having emitter, base, and collector regions, means interconnecting the emitter regions of the plural input transistors, means interconnecting the collector regions of the plural input transistors, an insulating layer on the semiconductor body, input means connected to the base regions of the plural input transistors and comprising plural parallel spaced strip-like connection conductors on the insulating layer and extending over the plural input transistors, and means connecting each of the connection conductors through a hole in the insulating layer, to respective base regions of the underlying transistors, at least two of the input transistors having elongated base regions extending in a direction perpendicular to the strip-like connection conductors such that the respective portions of said elongated base regions lie directly below and are connected to respective associated ones of said overlying connection conductors, said respective portions being unaligned with each other and at least one of the connection conductors being connected to one of said elongated base regions and extending over the other of said two elongated base regions.

2. An integrated circuit as set forth in claim 1, wherein the elongated base regions of said two input transistors have different longitudinal dimensions.

3. An integrated circuit as set forth in claim 2, wherein the emitter region of one of said two transistors is also elongated in a direction parallel to the elongation direction of its base region and extends toward said portion of the base region.

4. An integrated circuit as set forth in claim 3, wherein a resistor is connected to the interconnected emitters of the plural input transistors, said resistor extending underneath the connection conductors substantially perpendicular thereto.

5. An integrated circuit as set forth in claim 4, wherein an inverter transistor is provided having a base region connected to said resistor.

6. An integrated circuit as set forth in claim 4, wherein the connection conductors comprise two spaced apart groups of conductors, each of said groups extending over half of the input transistors, the emitter regions of the input transistors extending to a space between the conductor groups and interconnection to said emitter regions are located within said space, said resistor having a connection point located within said space and said resistor extending from there to below one of the conductors.

7. An integrated circuit as set forth in claim 6, wherein each conductor group comprises four conductors.

8. An integrated circuit as set forth in claim 1, wherein plural logic gates are provided in said semiconductor body, said plural logic gates being arranged in columns and said connection conductors being disposed so as to pass over said plural input transistors of each of the plural logic gates, and all of the input transistors have respective elongated base and emitter contacts that are spaced apart in the longitudinal direction of the elongated base regions.

9. An integrated circuit comprising plural logic gates as set forth in claim 1 arranged to form a code-converting circuit.

* * * * *